(12) United States Patent
Hoefer

(10) Patent No.: US 10,939,565 B2
(45) Date of Patent: Mar. 2, 2021

(54) TRANSMISSION CONTROL DEVICE, IN PARTICULAR FOR A MOTOR VEHICLE, AND METHOD FOR PRODUCING AN ELECTRICAL-CONNECTOR HOUSING

(71) Applicant: Robert Bosch GmbH, Stuttgart (DE)

(72) Inventor: Michael Hoefer, Reichenbach (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/468,952

(22) PCT Filed: Oct. 20, 2017

(86) PCT No.: PCT/EP2017/076859
§ 371 (c)(1),
(2) Date: Jun. 12, 2019

(87) PCT Pub. No.: WO2018/108364
PCT Pub. Date: Jun. 21, 2018

(65) Prior Publication Data
US 2020/0084898 A1 Mar. 12, 2020

(30) Foreign Application Priority Data
Dec. 13, 2016 (DE) .................... 10 2016 224 795.6

(51) Int. Cl.
*H05K 5/00* (2006.01)
*B29C 45/02* (2006.01)
(Continued)

(52) U.S. Cl.
CPC .......... *H05K 5/0034* (2013.01); *B29C 45/02* (2013.01); *B29C 45/14* (2013.01);
(Continued)

(58) Field of Classification Search
CPC ............ H01R 13/6658; H01R 13/5845; H01R 13/405; H01R 43/24; H01R 24/62;
(Continued)

(56) References Cited

U.S. PATENT DOCUMENTS 9,320,168 B2 * 4/2016 Drew ..................... H05K 5/006
9,736,952 B2 * 8/2017 Kajiwara ........... H05K 7/20854

FOREIGN PATENT DOCUMENTS

CN          104956547 A    9/2015
DE    10 2008 043 774 A1    5/2010
(Continued)

OTHER PUBLICATIONS

International Search Report corresponding to PCT Application No. PCT/EP2017/076859, dated Dec. 8, 2017 (German and English language document) (7 pages).

*Primary Examiner* — Gary F Paumen
(74) *Attorney, Agent, or Firm* — Maginot, Moore & Beck LLP

(57) ABSTRACT

A transmission control device, in particular for a motor vehicle, includes a circuit board element, and an electrical-connector housing. The circuit board element has electronic components. The electrical-connector housing is configured to receive an electrical connector, and to electrically connect the electrical connector to the circuit board element. The electrical-connector housing substantially consists of a thermoset material, and partially encloses the circuit board element via direct contact in an integrally bonded fashion.

13 Claims, 2 Drawing Sheets

(51) Int. Cl.
  *B29C 45/14*    (2006.01)
  *B60R 16/023*   (2006.01)
  *F16H 61/02*    (2006.01)
  *H01R 13/405*   (2006.01)
  *H01R 24/62*    (2011.01)
  *H01R 43/24*    (2006.01)
  *H05K 1/02*     (2006.01)
  *H05K 1/11*     (2006.01)
  *B29K 101/10*   (2006.01)
  *B29L 31/34*    (2006.01)

(52) U.S. Cl.
  CPC ..... *B60R 16/0231* (2013.01); *F16H 61/0251* (2013.01); *H01R 13/405* (2013.01); *H01R 24/62* (2013.01); *H01R 43/24* (2013.01); *H05K 1/0278* (2013.01); *H05K 1/117* (2013.01); *H05K 5/0082* (2013.01); *B29K 2101/10* (2013.01); *B29L 2031/3481* (2013.01)

(58) Field of Classification Search
  CPC .. H05K 5/0034; H05K 5/0082; H05K 1/0278; H05K 1/117; B29C 45/02; B29C 45/14; B60R 16/0231; F16H 61/0251; B29K 2101/10; B29L 2031/3481
  USPC ........................................ 439/76.1, 604–606
  See application file for complete search history.

(56) References Cited

FOREIGN PATENT DOCUMENTS

| | | |
|---|---|---|
| DE | 10 2013 206 256 A1 | 10/2014 |
| DE | 10 2013 209 296 A1 | 11/2014 |
| EP | 1 575 344 A1 | 9/2005 |
| EP | 1 672 972 A1 | 6/2006 |
| EP | 2 953 210 A1 | 12/2015 |
| JP | 2010-067773 A | 3/2010 |
| WO | 2013/167588 A2 | 11/2013 |

* cited by examiner

TRANSMISSION CONTROL DEVICE, IN PARTICULAR FOR A MOTOR VEHICLE, AND METHOD FOR PRODUCING AN ELECTRICAL-CONNECTOR HOUSING

This application is a 35 U.S.C. § 371 National Stage Application of PCT/EP2017/076859, filed on Oct. 20, 2017, which claims the benefit of priority to Serial No. DE 10 2016 224 795.6, filed on Dec. 13, 2016 in Germany, the disclosures of which are incorporated herein by reference in their entirety.

The disclosure relates to a transmission control device, in particular for a motor vehicle, and to a method for producing an electrical-connector housing.

BACKGROUND

Transmission control devices, in particular for motor vehicles, have to be connected via plug connectors or electrical-connector housings to electrical connectors for signal transmission that are intended to be electrically connected to the circuit board element.

Transmission control devices are often arranged in an oil environment. It is therefore necessary for the connection between the plug connector or the electrical-connector housing and the circuit board element of the transmission control device or the conductor tracks to be formed customarily in an oil-tight manner.

For this purpose, an electrical-connector housing with a connector on the basis of stamped conductor tracks is often used. Where appropriate, the conductor tracks and/or the thermoplastic material around the conductor tracks are/is then potted.

A disadvantage with previously known transmission control devices is that the production process is as a rule technically complicated. A plurality of different tools are generally required to produce the electrical-connector housing or the transmission control device with electrical-connector housing. This customarily leads to high production costs. Moreover, under some unfavorable circumstances, the region between the electrical-connector housing and the circuit board element of the transmission control device is be not securely oil-tight over the entire service life of the motor vehicle.

SUMMARY

Embodiments of the present disclosure can advantageously allow the possibility of providing a durable or very long-lasting oil-tight connection between the electrical-connector housing and the circuit board element of the transmission control device.

According to a first aspect of the disclosure, a transmission control device, in particular for a motor vehicle, is proposed, wherein the transmission control device comprises the following: a circuit board element having electronic components, and an electrical-connector housing for receiving an electrical connector and for electrically connecting the electrical connector to the circuit board element, characterized in that the electrical-connector housing substantially consists of thermoset material, wherein the electrical-connector housing partially encloses the circuit board element in direct contact in an integrally bonded manner.

One advantage thereof is that the transmission control device can as a rule be produced in a technically simple manner. Moreover, the connection between the electrical-connector housing and the circuit board element is customarily oil-tight in a durable manner or over a very long time period (for example more than 20 years or more than 25 years). Moreover, the production of the transmission control device generally requires only one tool or a small number of tools. In particular, no stamping tools and/or pre-encapsulating molds are required as a rule. The production costs are thus low as a rule.

Thermoset material can particularly be a plastic which, after curing thereof, can no longer be deformed by heating or other measures. No adhesive or the like is arranged between the thermoset material and the circuit board element; rather, the thermoset material forms an integrally bonded connection directly with the outer surface of the circuit board element. Thermoset materials are customarily also referred to as duromers. In particular, the thermoset material can as a rule be epoxy resin, chitin, urea-formaldehyde resin, melamine-formaldehyde resin, phenol-formaldehyde resin, polyester, polyurethane and/or unsaturated polyester.

According to a second aspect of the disclosure, a method for producing an electrical-connector housing on a circuit board element of a transmission control device, in particular for a motor vehicle, is proposed, wherein the electrical-connector housing is designed to receive an electrical connector and to electrically connect the electrical connector to the circuit board element, wherein the method comprises the following steps: providing the circuit board element; applying a thermoset material directly to a part of the circuit board element to form the electrical-connector housing; and curing the thermoset material.

One advantage thereof is that the method is technically simple. Moreover, the connection, produced by the method, between the electrical-connector housing and the circuit board element is customarily oil-tight in a permanent manner or over a very long time period (for example more than 15 years or 20 years or more than 25 years). Moreover, the method generally requires only one tool or a small number of tools. In particular, no stamping tools and/or pre-encapsulating molds are required as a rule. The production costs are thus low as a rule.

Ideas of embodiments of the present disclosure can, inter alia, be considered as being based on the below-described concepts and findings.

According to one embodiment, the circuit board element comprises a connection element having a contact region for electrically connecting the connection element to the electrical connector, a substantially flexible intermediate element and a base element, wherein the base element is electrically connected to the connection element via the intermediate element, and the intermediate element is substantially completely enclosed by the thermoset material. The flexible intermediate element generally allows the orientation of the connection element or of the electrical-connector housing, during the production of the electrical-connector housing, to be adapted to different circumstances in a technically simple manner. Thus, the orientation of the electrical-connector housing or of the electrical connector receptacle can be adapted or varied in a technically simple manner during the production. "Flexible" is also to be understood as meaning a semi-flexible or partially flexible intermediate element. The flexible intermediate element can be formed, for example, by milling away a part of the (rigid) circuit board element of the transmission control device, with the result that the circuit board element becomes thinner and thus (semi-)flexible at this point.

According to one embodiment, the circuit board element, in particular the connection element, has a contact region which is exposed on its outer surface and which is intended for the electrical connection of the circuit board element to the electrical connector, and thermoset material is partially arranged on the contact region. There is thus generally no need during the production to strictly take care to ensure that no thermoset material reaches the contact region. This generally simplifies the production process.

According to one embodiment, surfaces of the intermediate element consist of the same material as surfaces of the base element and/or connection element. One advantage thereof is that the thermoset material forms, with all parts of the circuit board element, that is to say base element, intermediate element and connection element, an integrally bonded and therefore durable or very long-life oil-tight connection.

According to one embodiment, the electrical-connector housing partially encloses the contact region. As a result, the connection between electrical-connector housing and electrical connector is generally sealed in a technically simple and particularly secure oil-tight manner.

According to one embodiment, the circuit board element comprises a connection element, a substantially flexible intermediate element and a base element, wherein the base element is electrically connected to the connection element via the intermediate element, and the thermoset material is applied to a part of the base element, a part of the connection element and to the intermediate element in such a way that the intermediate element is substantially completely enclosed by the thermoset material. The flexible intermediate element generally allows the orientation of the connection element or of the electrical-connector housing, during the production of the electrical-connector housing, to be adapted to different circumstances in a technically simple manner. Thus, the orientation of the electrical-connector housing or of the electrical connector receptacle can be adapted or varied in a technically simple manner during the production. "Flexible" is also to be understood as meaning a semi-flexible or partially flexible intermediate element. The flexible intermediate element can be formed, for example, by milling away a part of the (rigid) circuit board element of the transmission control device, with the result that the circuit board element becomes thinner and thus (semi-)flexible at this point.

According to one embodiment, the thermoset material is applied by transfer molding and/or injection-molding. As a result, the thermoset material can generally be applied in a technically simple and cost-effective manner.

According to one embodiment, the thermoset material is partially applied to a contact region which is exposed on an outer surface of the connection element and which is designed to electrically connect the connection element to the electrical connector. One advantage thereof is that the thermoset material can as a rule be applied very quickly, since care does not have to be taken to ensure during the production that no thermoset material reaches the contact region. This generally simplifies the production process.

According to one embodiment, surfaces of the intermediate element consist of the same material as surfaces of the base element and/or connection element. One advantage thereof is that the thermoset material forms, with all parts of the circuit board element, that is to say base element, intermediate element and connection element, an integrally bonded and therefore durable or very long-lasting oil-tight connection.

It should be pointed out that some of the possible features and advantages of the disclosure are described herein with respect to different embodiments of the transmission control device or of the method for producing an electrical-connector housing. A person skilled in the art will recognize that the features can be combined, adapted or interchanged in a suitable manner to arrive at further embodiments of the disclosure.

BRIEF DESCRIPTION OF THE DRAWINGS

Embodiments of the disclosure will be described below with reference to the appended drawings, with it being the case that neither the drawings nor the description are to be interpreted as limiting the disclosure.

The figures are purely schematic and not true to scale. In the figures, the same reference signs designate identical or identically acting features.

DETAILED DESCRIPTION

Figure 1:
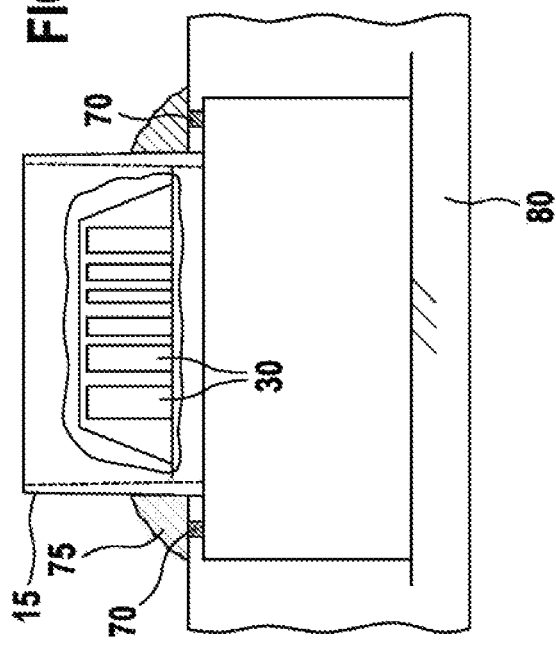
FIG. 1 shows a cross-sectional view of one embodiment of the transmission control device according to the disclosure.
Figure 2:
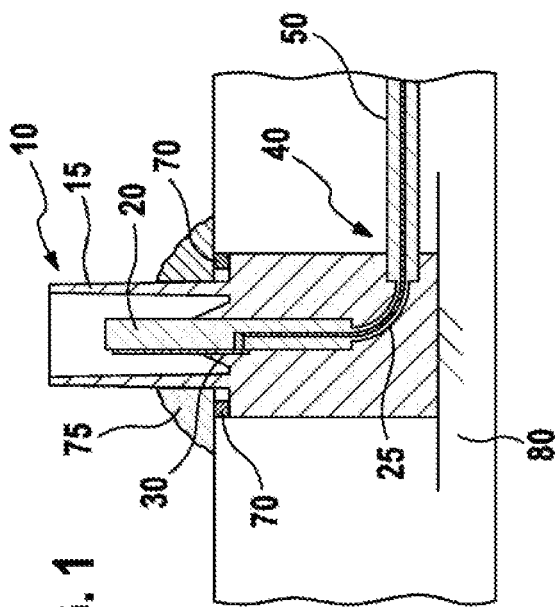
FIG. 2 shows a further cross-sectional view of the transmission control device from FIG. 1.
Figure 3:
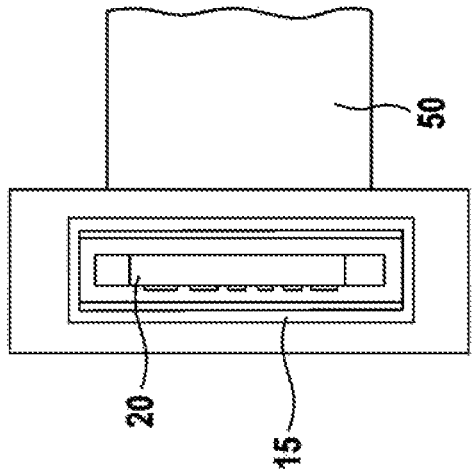
FIG. 3 shows a plan view of the transmission control device from FIG. 1.

FIG. 1 shows a cross-sectional view of one embodiment of the transmission control device 10 according to the disclosure. FIG. 2 shows a further cross-sectional view of the transmission control device 10 of FIG. 1. FIG. 3 shows a plan view of the transmission control device 10 from FIG. 1.

The transmission control device 10 can be seen only in part in FIG. 1. The transmission control device 10 comprises a circuit board element 40. Electronic components are arranged on the circuit board element 40. However, said components are not illustrated in the drawings. The circuit board element 40 comprises a base element 50, an intermediate element 25 and an electrical connection element 20 also referred to herein as a connection element. The base element 50, the intermediate element 25 and the connection element 20 each comprise in their center one or more electrical conductors. The intermediate element 25 electrically connects the base element 50 to the connection element 20. The electrically conducting element is completely enclosed by the base element 50 and the intermediate element 25 in each case.

The intermediate element 25 is designed to be flexible or bendable. For this purpose, an upper and lower (in FIG. 1) region of the circuit board element 40 can have been or can be removed in order thereby to reduce the height of the intermediate element 25 and to make it bendable or flexible.

An electrical-connector housing 15 consisting of a thermoset material is formed on the circuit board element 40. The thermoset material completely encloses the intermediate element 25 and encloses a part of the base element 50 and a part of the connection element 20 that in each case faces the intermediate element 25. Under vibration excitation, the intermediate element 25 is only slightly mechanically loaded since it is completely surrounded by thermoset material.

The electrical-connector housing 15 serves to receive an electrical connector, for example an electrical connector of a sensor or of a power connection which is intended to be electrically connected to the circuit board element 40. The electrical connector is inserted from top to bottom into the electrical-connector housing 15 in FIG. 1.

The connection element 20 has a contact region 30 which is exposed (with respect to the surroundings). The contact region 30 extends on the outer surface of the connection element 20. The electrical conductor extends, approximately in the center of the connection element 20, from the outer surface of the connection element 20 into the interior of the connection element 20. In the lower half of the connection element 20, the electrical conductor extends completely within the connection element 20.

The integral or one-piece electrical-connector housing 15 surrounds the contact region 30 and completely encloses the intermediate element 25.

The electrical-connector housing 15 forms an integrally bonded oil-tight connection with the circuit board element 40. No adhesive or the like is arranged between the electrical-connector housing 15 and the circuit board element 40. The thermoset material is applied directly to the circuit board element 40. The circuit board element can consist in particular of an epoxy resin-impregnated glass-fiber mat (FR4).

No oil thus penetrates into the region between the electrical-connector housing 15 and the circuit board element 40 over the entire service life of a motor vehicle (for example 15 years, 20 years or 25 years).

The electrical connector has a shape which is complementary to the receiving region of the electrical-connector housing 15. The electrical connector is received in the electrical-connector housing 15 in such a way that an oil-tight connection is established between electrical connector and electrical-connector housing 15. In other words, no oil penetrates into or through the interspace between electrical connector and electrical-connector housing 15.

The intermediate element 25 and the connection element 20 do not necessarily have to be present. It is also conceivable that the circuit board element 40 only a base element 50 which has the contact region 30. In this case, the electrical-connector housing 15 is formed on the base element 50 and encloses a part of the base element 50 in an oil-tight manner.

The thermoset material can be arranged partially on the contact region 30 or the conductor tracks of the contact region 30 (see FIG. 2). At least a part of the contact region 30 or of each conductor track or of each electrical conductor of the contact region 30 must be exposed in order that an electrical connector can be electrically connected to the contact region 30.

The connection element 20 extends with its largest extent (longitudinal direction of the connection element 20, in FIG. 1 from top to bottom) at an angle of about 90° to the direction of the largest extent of the base element 50 (longitudinal direction of the base element 50, in FIG. 1 from left to right).

The electrical-connector housing 15 is arranged or fastened on a transmission plate 80 or mounting plate. The receptacle of the electrical-connector housing 15 for receiving an electrical connector can have an angle of about 90° to the transmission plate 80. The electrical-connector housing 15 is arranged in a transmission housing 75. The intermediate region or interspace between the transmission housing 75 and the electrical-connector housing 15 is sealed in an oil-tight manner by a peripheral seal 70 (for example an elastomer seal). Thus, oil cannot penetrate into the transmission housing 75 over any path, neither through the region between electrical-connector housing 15 and the transmission housing 75 nor through the region between circuit board element 40 or connection element 20 and electrical-connector housing 15. Thus, the transmission control device 10 is sealed in an oil-tight or liquid-tight manner in the long term or over a very long time period (for example 20 years). This also applies if the transmission control device 10 is permanently situated in an oil environment.

Figure 4:
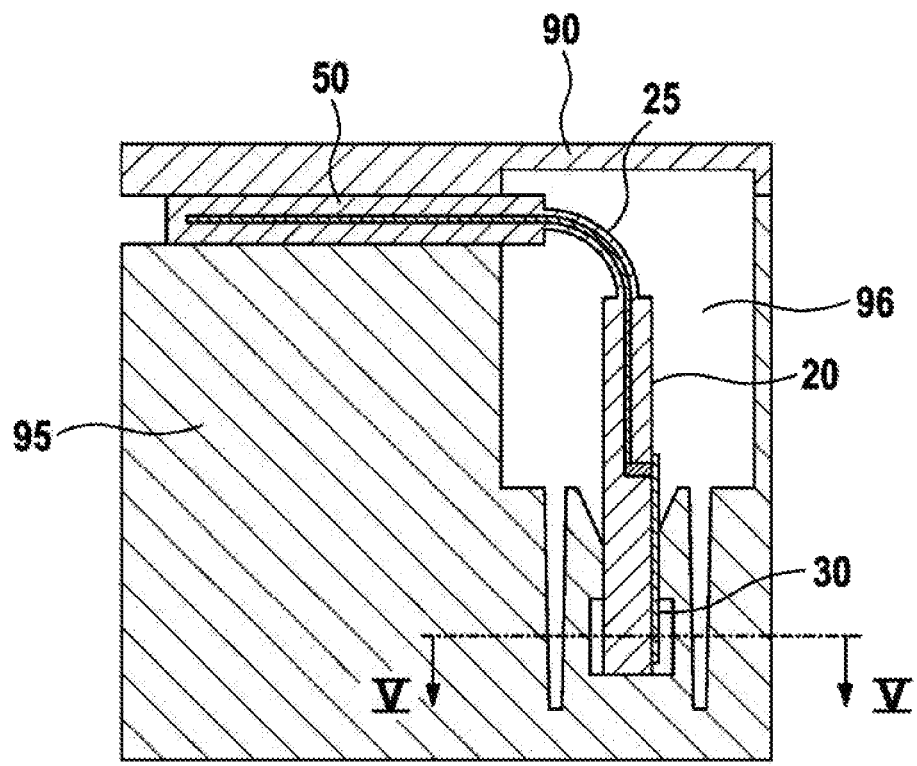
FIG. 4 shows a cross-sectional view of a production mold for producing the electrical-connector housing.
Figure 5:
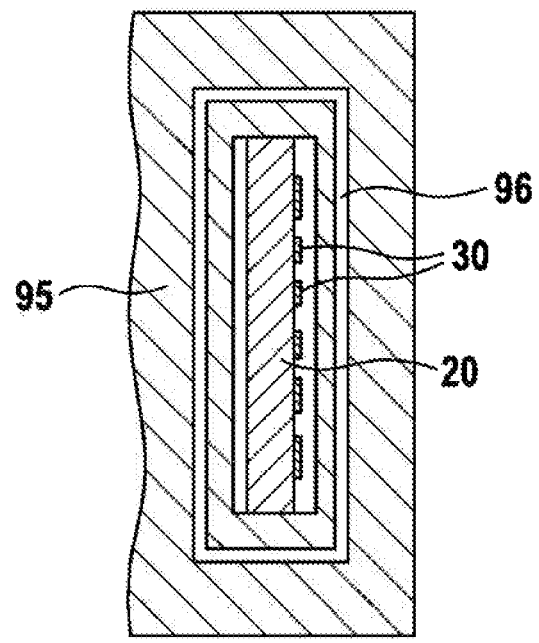
FIG. 5 shows a cross-sectional view of the production mold from FIG. 4 along the line V-V.

FIG. 4 shows a cross-sectional view of a production mold for producing the electrical-connector housing 15. FIG. 5 shows a cross-sectional view of the production mold from FIG. 4 along the line V-V.

The method for producing the electrical-connector housing 15 will be described below. The circuit board element 40 of a transmission control device 10 is provided. In the embodiment shown in FIG. 4 or FIG. 5, the circuit board element 40 comprises a connection element 20, an intermediate element 25 and a base element 50. The connection element 20 extends with its largest extent (longitudinal direction of the connection element 20, in FIG. 4 from top to bottom) at an angle of about 90° to the largest extent of the base element 50 (longitudinal direction of the base element 50, in FIG. 4 from left to right).

The circuit board element 40 is placed or clamped in a mold between the mold upper part 90 and the mold lower part 95.

The mold has a cavity 96 in which the intermediate element 25 and a part of the base element 50 and a part of the connection element 20 that is intended to be surrounded by the thermoset material is arranged.

The contact region 30 has one or more conductor tracks. The conductor tracks can consist, for example, of copper or a copper alloy. The region between electrical-connector housing and the conductor tracks is designed to be oil-tight. No oil penetrates along the conductor tracks.

A part of the exposed contact region 30 or of the conductor tracks of the contact region 30 is sealed with respect to the cavity 96 by the mold lower part, with the result that, when thermoset material is introduced into the cavity 96, no thermoset material passes to or into this region of the contact region 30. The mold lower part also has such an inner shape that an electrical-connector housing 15 for receiving an electrical connector and for electrically connecting the electrical connector to the contact region 30 is formed when filling the cavity 96 with a thermoset material.

The thermoset material is introduced into the cavity 96 until the cavity 96 is completely filled with thermoset material. The thermoset material is then cured. The electrical-connector housing 15, as is shown in FIG. 1 or FIG. 2 or FIG. 3, is now formed. The formed electrical-connector housing 15 completely encloses the intermediate element 25. The electrical-connector housing 15 likewise encloses a part of the base element 50 and a part of the connection element 20. There is therefore formed an oil-tight connection between the electrical-connector housing 15 and the base board element. The electrical-connector housing 15 forms a (long-lasting) integrally bonded oil-tight connection with the circuit board element 40. No adhesive or the like is arranged between the electrical-connector housing 15 and the circuit board element 40. The thermoset material is applied directly to the circuit board element 40.

The thermoset material is applied to the circuit board element 40 by transfer molding and/or thermoset injection-molding.

Finally, it should be pointed out that terms such as "having", "comprising", etc. do not exclude other elements or steps, and terms such as "one", "a" or "an" do not exclude a plurality. Reference signs in the claims are not to be considered as a limitation.

The invention claimed is:

1. A transmission control device comprising:
   a circuit board element including
      electronic components,
      an electrical connection element with an exposed contact region,
      a substantially flexible intermediate element, and
      a base element electrically connected to the electrical connection element by the intermediate element; and
   an electrical-connector housing configured to (i) receive an electrical connector and (ii) guide the electrical connector to mate with the electrical connection element, wherein:
      the electrical-connector housing substantially consists of a thermoset material;
      the electrical-connector housing partially encloses the circuit board element via direct contact in an integrally bonded fashion, and
      the thermoset material is applied to a part of the base element, a part of the electrical connection element and to the intermediate element such that the intermediate element is substantially completely enclosed by the thermoset material.

2. The transmission control device as claimed in claim 1, wherein:
   an outer surface of the exposed contact region is exposed.

3. The transmission control device as claimed in claim 1, wherein surfaces of the intermediate element consist of a same material as surfaces of at least one of the base element and the electrical connection element.

4. The transmission control device as claimed in claim 2, wherein the electrical-connector housing only partially encloses the exposed contact region.

5. The transmission control device as claimed in claim 1, wherein the transmission control device is for a motor vehicle.

6. The transmission control device as claimed in claim 2, wherein the exposed contact region is located on an outer surface of the electrical connection element.

7. The transmission control device as claimed in claim 1, further comprising:
   at least one electrical conductor extending through a center portion of the substantially flexible intermediate element and the base element.

8. The transmission control device of claim 7, wherein:
   the electrical connection element includes an exposed portion extending partially outwardly of the thermoset material; and
   the at least one conductor comprises the exposed contact region.

9. A method for producing an electrical-connector housing on a circuit board element of a transmission control device comprising:
   providing the circuit board element, the circuit board element including
      an electrical connection element with an exposed contact region,
      a substantially flexible intermediate element, and
      a base element electrically connected to the electrical connection element by the intermediate element;
   applying a thermoset material directly to a part of the circuit board element to form the electrical-connector housing, wherein the thermoset material is applied to a part of the base element, a part of the electrical connection element, and to the intermediate element such that the intermediate element is substantially completely enclosed by the thermoset material; and
   curing the thermoset material so that the electrical-connector housing is configured to receive an electrical connector and guide the electrical connector to mate with the electrical connection element.

10. The method as claimed in claim 9, wherein the thermoset material is applied via at least one of transfer molding and injection-molding.

11. The method as claimed in claim 9, wherein applying the thermoset material further comprises:
   partially applying the thermoset material to the exposed contact region on an outer surface of the electrical connection element, the exposed contact region configured to electrically connect the electrical connection element to the electrical connector.

12. The method as claimed in claim 9 wherein surfaces of the intermediate element consist of a same material as surfaces of at least one of the base element and the electrical connection element.

13. The method of claim 11, wherein:
   the exposed contact region is an exposed contact region of at least one conductor; and
   partially applying the thermoset material further includes partially applying the thermoset material to a first portion of the exposed contact region on the outer surface of the electrical connection element such that a second portion of the exposed contact region of the at least one conductor and a portion of the electrical connection element extend outwardly of the thermoset material.

* * * * *